US007145374B2

(12) United States Patent
Lin et al.

(10) Patent No.: US 7,145,374 B2
(45) Date of Patent: *Dec. 5, 2006

(54) METHODS AND APPARATUS FOR DELAY CIRCUIT

(75) Inventors: Feng Lin, Boise, ID (US); Tyler J. Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/202,513

(22) Filed: Aug. 11, 2005

(65) Prior Publication Data

US 2005/0264331 A1 Dec. 1, 2005

Related U.S. Application Data

(63) Continuation of application No. 10/167,709, filed on Jun. 12, 2002, now Pat. No. 6,930,525.

(51) Int. Cl.
*H03L 7/00* (2006.01)

(52) U.S. Cl. ...................... 327/161; 327/276

(58) Field of Classification Search .............. 327/149, 327/150, 152, 158, 154, 161, 261, 269, 276, 327/277, 291; 375/359, 376
See application file for complete search history.

(56) References Cited

U.S. PATENT DOCUMENTS

| | | | | |
|---|---|---|---|---|
| 5,699,003 A | * | 12/1997 | Saeki | 327/261 |
| 5,901,190 A | * | 5/1999 | Lee | 375/373 |
| 6,018,259 A | | 1/2000 | Lee | 327/159 |
| 6,194,937 B1 | * | 2/2001 | Minami | 327/270 |
| 6,239,635 B1 | | 5/2001 | Matsuzaki | 327/165 |
| 6,373,913 B1 | * | 4/2002 | Lee | 375/376 |
| 6,930,525 B1 | | 8/2005 | Lin et al. | 327/161 |

* cited by examiner

*Primary Examiner*—Dinh T Le
(74) *Attorney, Agent, or Firm*—Snell & Wilmer LLP (57) ABSTRACT

The present invention provides apparatus and methods relating to delay circuits. An electronic system includes a deskewing circuit configured to measure a delay and generate a synchronized signal according to the measured delay. The deskewing circuit may configured to detect an overflow condition and respond accordingly, for example by asserting an overflow signal. Further, the deskewing circuit may be additionally or alternatively configured to detect successful measurement of the delay and respond, for example by executing a power saving and/or noise reducing procedure.

15 Claims, 8 Drawing Sheets

METHODS AND APPARATUS FOR DELAY CIRCUIT

CROSS-REFERENCE TO RELATED APPLICATIONS

This application claims the benefit of the filing date of U.S. patent application, Ser. No. 10/167,709 entitled "Methods and Apparatus for Delay Circuit," filed on Jun. 12, 2002, now U.S. Pat. No. 6,930,525, and is incorporated herein by reference.

1. Field of Invention

The present invention generally relates to electronic circuits.

2. Background of the Invention

Many electronic devices use clock signals to coordinate operation of components. For example, electronic systems using synchronous dynamic random access memories (SDRAMs) commonly coordinate the SDRAM output with the system clock. Consequently, most SDRAMs and other components receive the system clock for synchronizing the SDRAMs' operations with the other components in the system.

Clock skew, however, disrupts the coordination between the system clock and the output signal of the SDRAM. Clock skew is a delay between the externally-supplied system clock signal and the signal used by the SDRAM output circuitry to generate the output signals. Several causes, including delays associated with the clock input buffer, drivers, and other resistive-capacitive circuit elements, contribute to clock skew.

Several solutions can correct clock skew to coordinate the system clock with the SDRAM clock. For example, some systems use delay-locked loops (DLLs) or phase-locked loops (PLLs) to lock the SDRAM output data to the system clock signal. DLLs and PLLs, however, require a relatively long time to lock onto the input signal. Further, temperature and voltage variations may degrade the performance of DLLs and PLLs.

Synchronized delay circuits are another popular deskewing solution, such as clock-synchronized delay (CSD) circuits and synchronized mirror delay (SMD) circuits. Synchronized delay circuits typically offer faster lock performance than DLLs and PLLs. For example, conventional SMD circuits may lock onto the input signal in two cycles; conventional CSD circuits may lock onto the input signal in a single cycle.

Figure 1:
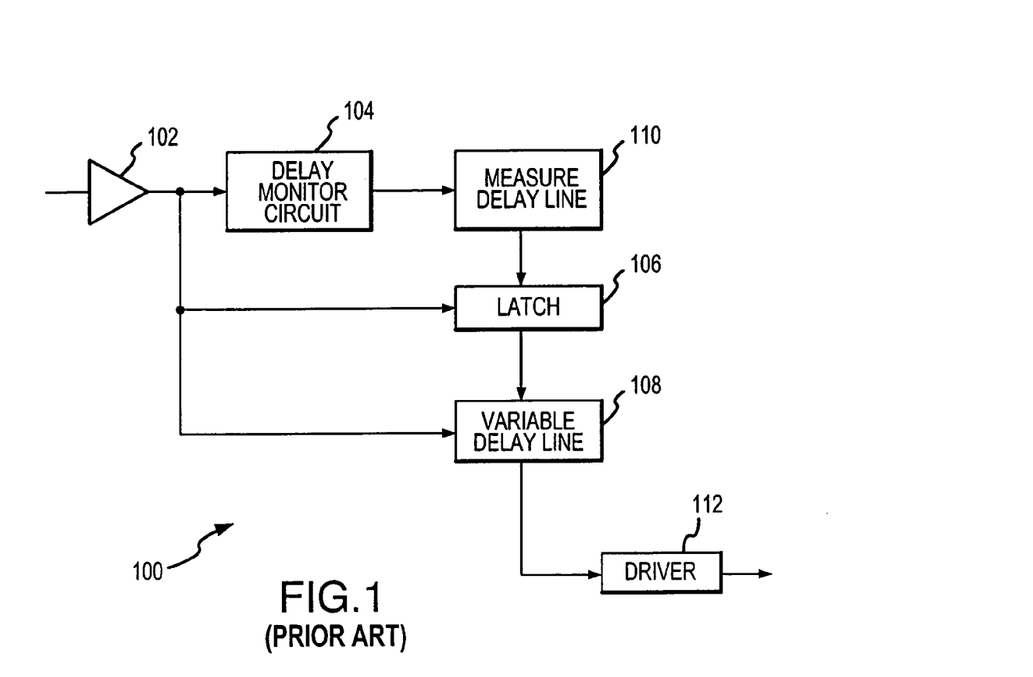
FIG. 1 is a conventional CSD circuit.

Referring to FIG. 1, a conventional CSD circuit 100 comprises an input buffer 102 to receive the system clock signal and provide it to a delay monitor circuit 104, a latch 106, and a variable delay line 108. The delay monitor circuit 104 inserts a desired delay into the signal and provides the delayed input signal to a measure delay line 110. The measure delay line 110 measures the difference between the delayed signal from the delay monitor circuit 104 and the system clock. The measured delay is communicated to the latch 106. The latch 106 is read by the variable delay line 108, and the variable delay line 108 generates a signal delayed by the same delay as measured by the measure delay line 110. The signal from the variable delay line 108 is then provided to a clock driver circuit 112 to amplify and distribute the synchronized signal.

Figure 2:
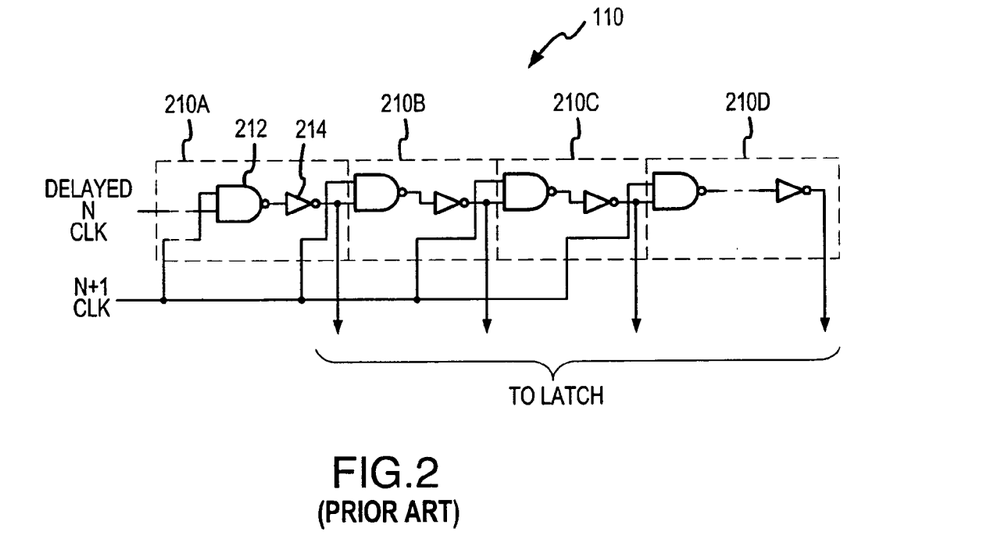
FIG. 2 is a conventional measure delay circuit.
Figure 3:
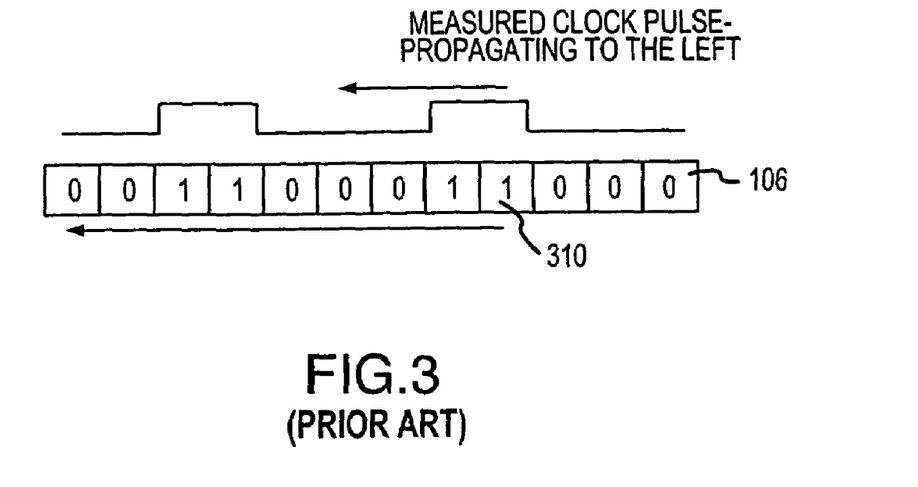
FIG. 3 is a conventional register.

The measure delay line 110 suitably measures the delay by receiving the input signal through a series of stages, each of which generates a single-bit signal to indicate whether the particular stage corresponds to the measured delay. For example, referring to FIG. 2, the measure delay line 110 may comprise a series of stages 210, each stage comprising a NAND gate 212 and an inverter 214. Each stage 210 provides a signal to the latch 106 to indicate whether the delay has been successfully measured by the stage 210. Thus, referring to FIG. 3, the latch 106 receives a digital word. The delay is successfully measured by the stage 210 that provides the first logic HIGH signal, which is referred to as the entry point 310, to the latch 106.

In some applications, such as portable battery-driven devices, synchronized delay circuits may consume excessive power and/or generate noise. The additional power consumption and noise generation is due to portions of the digital delay elements toggling unnecessarily. Further, a single synchronized delay circuit may be used to synchronize at many different frequencies. For especially slow frequencies, the sampling frequency of the synchronized delay circuit may be so high that all of the samples are taken before the first pulse of the input signal arrives, causing an overflow condition. In other words, the synchronized delay circuit cannot measure a delay exceeding a particular limit.

SUMMARY OF THE INVENTION

An electronic system according to various aspects of the present invention includes a deskewing circuit. The deskewing circuit is configured to measure a delay and generate a synchronized signal according to the measured delay. In addition, the deskewing circuit is configured to detect an overflow condition and respond accordingly, for example by asserting an overflow signal. Further, the deskewing circuit may be additionally or alternatively configured to detect successful measurement of the delay and respond, for example by executing a power saving and/or noise reducing procedure.

BRIEF DESCRIPTION OF EXEMPLARY DRAWINGS

Additional aspects of the present invention are evident upon reviewing the non-limiting embodiments described in the specification and the claims, in conjunction with the accompanying figures, wherein like numerals designate like elements:

Elements in the figures are illustrated for simplicity and clarity and have not necessarily been drawn to scale. For example, the dimensions of some of the elements in the

DETAILED DESCRIPTION OF EXEMPLARY EMBODIMENTS

Various aspects and features of the present invention may be described in terms of functional components and steps. Such functional components and steps may be realized by any number of elements and/or steps configured to perform the specified functions. For example, the present methods and apparatus may employ electronic, signaling, and logic elements, like latches, registers, delay lines, and logic gates, which may carry out a variety of functions in various embodiments, applications, and environments. In addition, the present methods and apparatus may be practiced in conjunction with any number of procedures and systems, and the apparatus and methods described are merely exemplary applications for the invention. Further, the present methods and apparatus may employ any number of techniques, conventional or otherwise, for placement, use, manufacturing, and the like.

An electronic system according to various aspects of the present invention includes a plurality of components operating in conjunction with a delay measuring circuit. The components may comprise any components using a delay measuring circuit, such as multiple integrated circuits and electrical components on a single board, various elements in a single integrated circuit, various components of a computer system, or any other components. For example, referring to FIG. 4, an exemplary electronic system 400 suitably comprises a processor 410, a memory 412, and a clock generator 414. The processor 410 controls the electronic system 400 in accordance with a program. The processor 410 may comprise, for example, a conventional central processing unit, such as an Intel Pentium processor or an Advanced Micro Devices Athlon processor. The clock generator 414 generates a system clock signal and provides the system clock signal to various components of the electronic system 400, such as the processor 410 and the memory 412. The clock generator 414 may comprise any system for generating the system clock signal, such as a conventional timing device using a quartz crystal.

Figure 4:
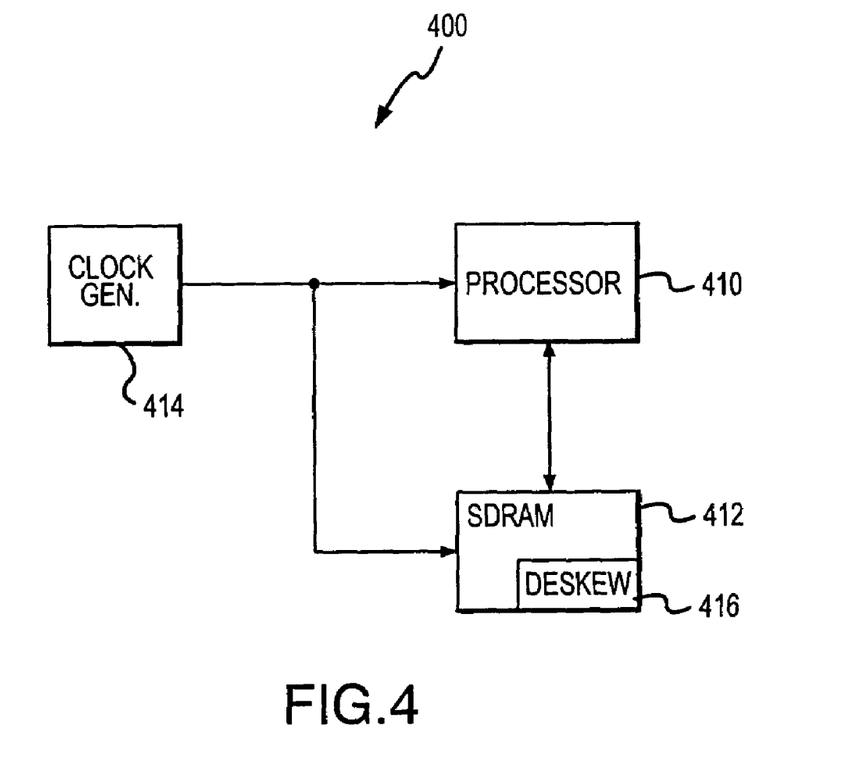
FIG. 4 is a block diagram of an electronic system according to various aspects of the present invention.

The memory 412 stores information for subsequent retrieval. The memory 412 may comprise any appropriate memory, memory system, or storage device or system. For example, the memory 412 may comprise a memory subsystem including a memory controller, multiple memory chips, and associated logic and circuitry. In the present embodiment, the memory 412 comprises an SDRAM, such as a DDR SDRAM available from Micron Technology, Inc.

The memory 412 includes a deskewing circuit 416. In the present embodiment, the deskewing circuit 416 is integrated into the SDRAM, though the deskewing circuit 416 may be integrated into other components of the memory 412 or implemented as a separate circuit. The deskewing circuit 416 according to various aspects of the present invention tends to synchronize a first signal and a second signal. In particular, the deskewing circuit 416 may be configured to synchronize an internal clock signal or a data signal to an external clock signal, such as the system clock signal generated by the clock generator 414. The deskewing circuit 416 may also be configured to initialize another component, such as a delay-locked loop. The deskewing circuit 116 may comprise any suitable deskewing circuit, such as a delay-locked loop (DLL), a phase-locked loop (PLL), a synchronous mirror delay circuit, a clock synchronized delay (CSD) circuit, or any other deskewing circuit or suitable combination of circuits.

In the present embodiment, the deskewing circuit 416 comprises a CSD circuit, alternatively referred to as a measure-controlled delay circuit. For example, referring to FIG. 5, a CSD circuit 500 according to various aspects of the present invention comprises a delay monitor circuit 510; a measure delay line 512; an intermediate element 514; a variable delay line 516; and an operation control circuit 518. The CSD circuit 500 is suitably configured to generate an output pulse synchronized to an input pulse by measuring a delay associated with an input buffer 520, an output driver 522, and/or any other relevant circuitry, and generating a pulse that is timed, based on the measured delay, to coincide with the input signal.

Figure 5:
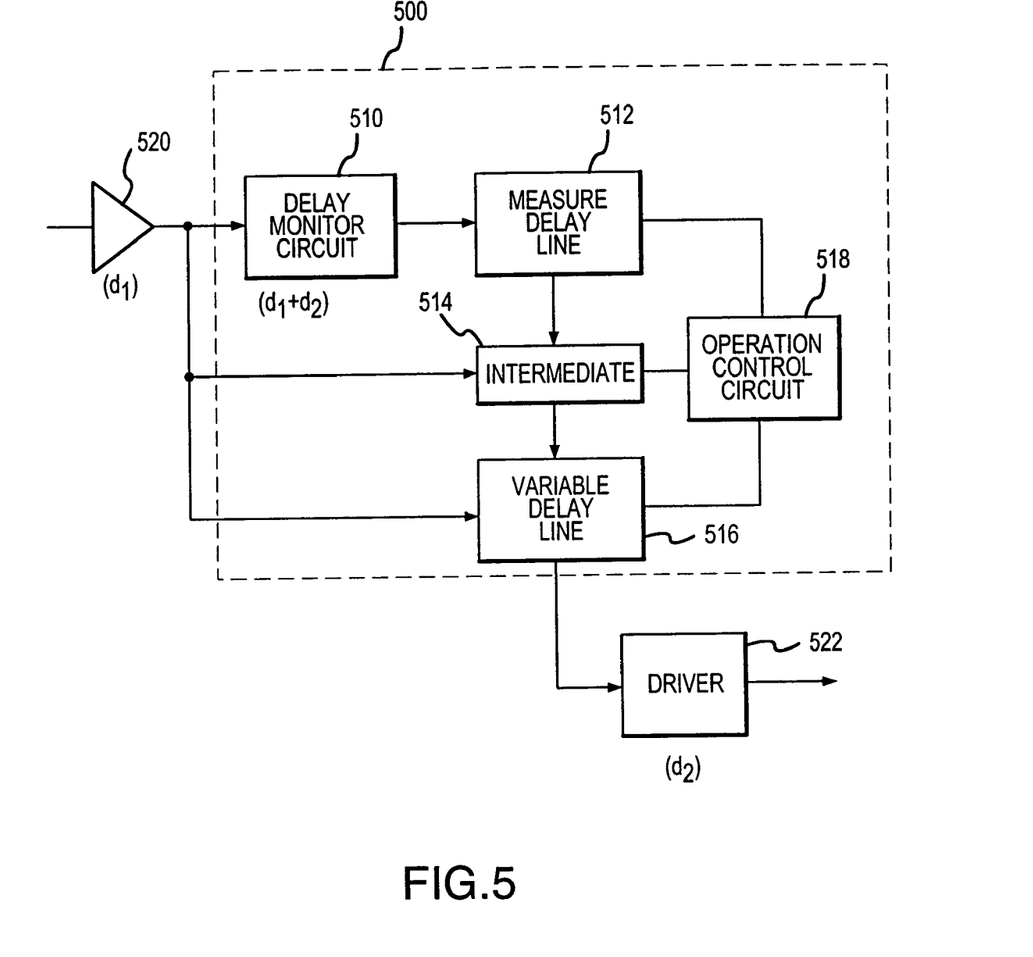
FIG. 5 is a block diagram of an exemplary synchronized delay circuit.

The delay monitor circuit 510 causes a propagation delay of a selected duration in an initial input signal. The selected delay may be adjusted to any desired duration. In the present embodiment, the delay is selected to emulate the delay associated with an input buffer 520 (d1) and the output driver circuit 522 (d2). The delay monitor circuit 510 may be implemented in any suitable manner to induce the desired delay (d1+d2), for example using a series of driver and buffer circuits.

After propagating through the delay monitor circuit 510, the delayed input signal propagates through the measure delay line 512. The measure delay line 512 is suitably configured to measure a delay duration for the deskewing operation. Based on the delay measured by the measure delay line 512, the CSD circuit 500 generates an output signal synchronized with the input signal. The measure delay line 512 may measure the delay in any suitable manner, such as by propagating the signal through a series of conventional stages in which each stage is associated with a certain delay period. For example, the measure delay line 512 may comprise an array of resistors, metal lines, a set of series-coupled NAND gates and inverters, or more complex logic gate delay circuits.

The measure delay line 512 suitably generates a measured delay signal corresponding to the measured delay and provides the measured delay signal to the variable delay line 516. In the present embodiment, for example, the measure delay line 512 suitably measures the delay, performs a time-to-digital conversion corresponding to the delay to generate the measured delay signal, and provides the measured delay signal to the intermediate element 514. The measured delay signal suitably comprises a digital word, which may be provided to the variable delay line 516 directly or indirectly from the measure delay line 512.

In the present embodiment, the measured delay signal is provided to the variable delay line 516 via the intermediate element 514. The intermediate element 514 stores and/or buffers the measured delay signal. The intermediate element 514 may comprise any suitable intermediate element for transferring the measured delay signal from the measure delay line 512 to the variable delay line 516, such as a latch, a register, or a buffer. Further, the intermediate element 514 may be a separate element or integrated into either the measure delay line 512 or the variable delay line 516.

In the present embodiment, the intermediate element 514 is configured to receive and store each bit of the digital word comprising the measured delay signal. For example, the intermediate element 514 suitably comprises a conventional capture register or latch configured to store digital information. Alternatively, the intermediate element 514 may be configured as a shift register, for example in applications in which the CSD circuit 500 initializes a DLL, or a mirror control circuit if the deskewing circuit 416 is implemented with a synchronous mirror delay circuit, or any other appropriate component.

The variable delay line 516 receives the measured delay signal from the measure delay line 512, for example via the intermediate element 514. The variable delay line 516 then generates a variable delay signal based on the measure delay signal. For example, the variable delay line 516 suitably performs a digital-to-time conversion by generating the variable delay signal characterized by a delay corresponding to the measure delay signal. Like the measure delay line 512, the variable delay line 516 may be implemented in any suitable manner, such as an array of resistors, metal lines, a set of series-coupled NAND gates and inverters, or more complex logic gate delay circuits. The variable delay signal is provided to the output driver 522, which suitably amplifies the clock signal or data signal from the variable delay line 516 to distribute the resulting deskewed signal.

The operation control circuit 518 controls the operation of various aspects of the CSD circuit 500. The operation control circuit 518 may be configured to control any selected aspect of the CSD circuit 500 in any suitable manner, such as to reduce power consumption and/or noise or detect and indicate an overflow condition. For example, the operation control circuit 518 may be configured to generate any selected response upon detection of the entry point 310, including a power-saving response and/or a non-overflow response.

The operation control circuit 518 according to various aspects of the present invention includes an overflow circuit. The overflow circuit is suitably configured to detect whether an overflow condition has occurred. For example, the overflow circuit may be configured to detect whether the entry point is in a signal within the operating range of the overflow circuit and respond according to any appropriate criteria. The overflow circuit may monitor any suitable signal to determine whether the entry point has been detected. The overflow circuit also suitably controls an overflow signal, such as an overflow flag, according to whether the entry point is detected.

The overflow circuit may be configured to monitor a selected signal during a selected period. For example, the selected period suitably extends from receipt of an initial pulse by a delay line 512, 516 for a duration corresponding to the total duration capacity or other operational range of the delay line. If no entry point 310 is detected during the selected period, then a delay overflow condition has occurred and the overflow circuit may adjust the overflow signal accordingly. The overflow signal may be monitored or otherwise received by another system, such as the processor 410, to identify overflow situations and respond.

Figure 6:
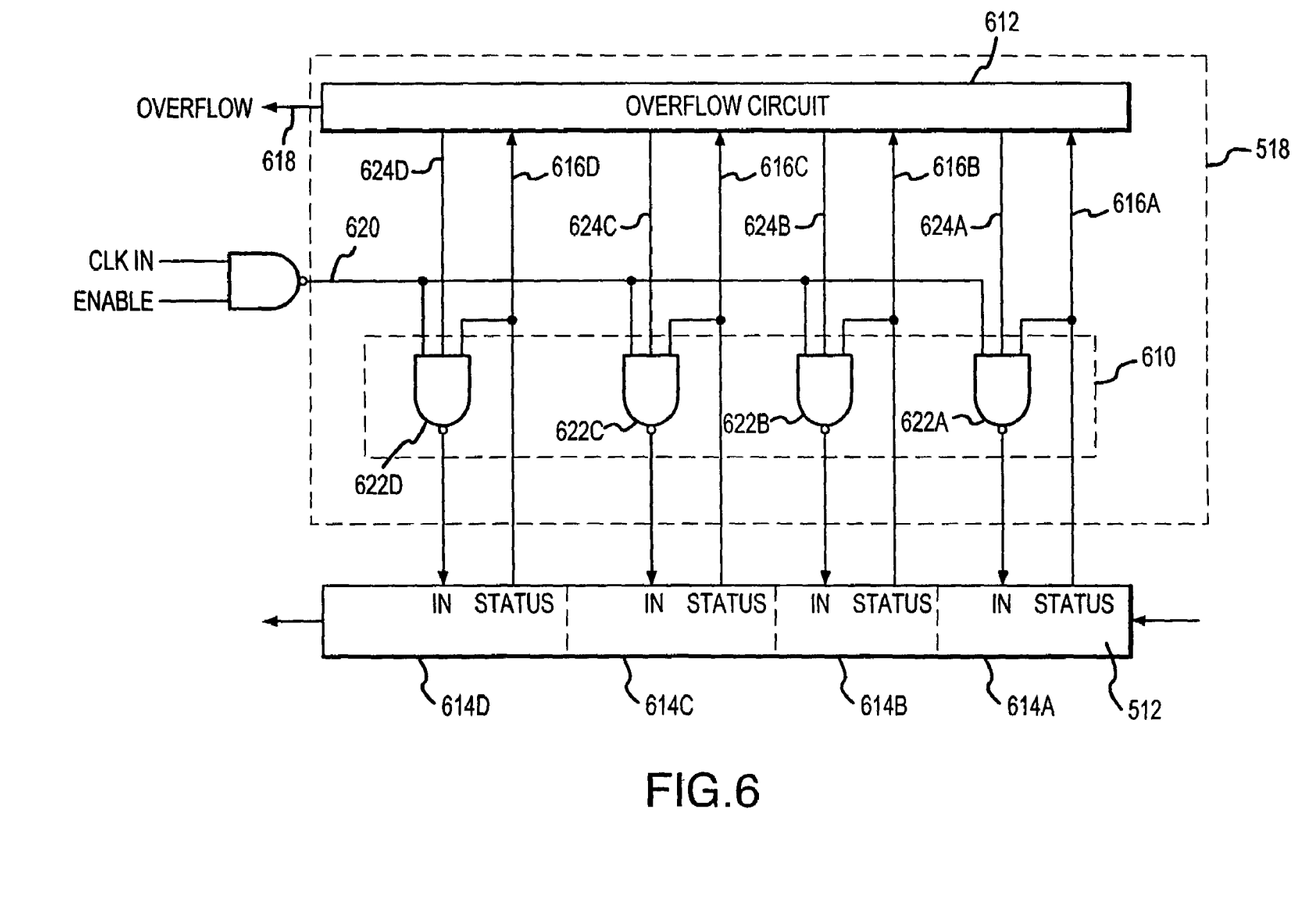
FIG. 6 is a schematic and block diagram of an exemplary operation control circuit.

For example, referring to FIG. 6, an overflow circuit 612 according to various aspects of the present invention may be configured to monitor the measure delay line 512 and activate the overflow signal 618 if the entry point 310 is not detected within the maximum measuring period of the measure delay line. The measure delay line 512 may be partitioned into multiple segments 614A–D. Each segment 614A–D suitably comprises one or more stages of the measure delay line 512 and includes a status output and a clock input. The status output is configured to generate a status signal 616A–D corresponding to whether any stage in the corresponding segment 614A–D detected the entry point 310. The entry point 310 may comprise any appropriate characteristic in the input signal. For example, the entry point 310 is suitably indicated by the first logic LOW to logic HIGH transition in the output of the measure delay line 512. Thus, successful measurement of the delay by the measure delay line 512 may be detected by monitoring the status signals 616 of the various segments 614.

The status signals 616 may be used in any suitable manner and monitored by any component. For example, in the present embodiment, the status signals 616 are provided to the overflow circuit 612. The overflow circuit 612 may be configured to respond to the status signals 616 from the measure delay line 512 according to any appropriate criteria. In the present embodiment, the overflow circuit 612 receives the status signals 616 from the various segments to determine whether the entry point has been detected. The overflow circuit 612 controls the overflow signal 618, such as an overflow flag, according to whether the entry point is detected. The overflow circuit 612 may be configured to monitor the status signals 616 during a selected period extending from receipt of a delayed pulse by the measure delay line 512 for a duration corresponding to the total duration capacity of the measure delay line 512. If the status signals 616 indicate that no entry point 310 was detected during the selected period, then an overflow condition has occurred and the overflow circuit 612 may adjust the overflow signal 618 accordingly. The overflow signal 618 may be monitored by another system, such as the processor 410, to identify overflow situations and respond.

The overflow circuit 612 may be configured to operate in conjunction with any suitable signal or component to detect an overflow condition and generate the overflow signal 618. For example, the overflow circuit 612 may generate the overflow signal 618 within the output signal of another component. Consequently, a separate overflow signal 618 is not provided, but is instead integrated into the output of another component.

Figure 8A:
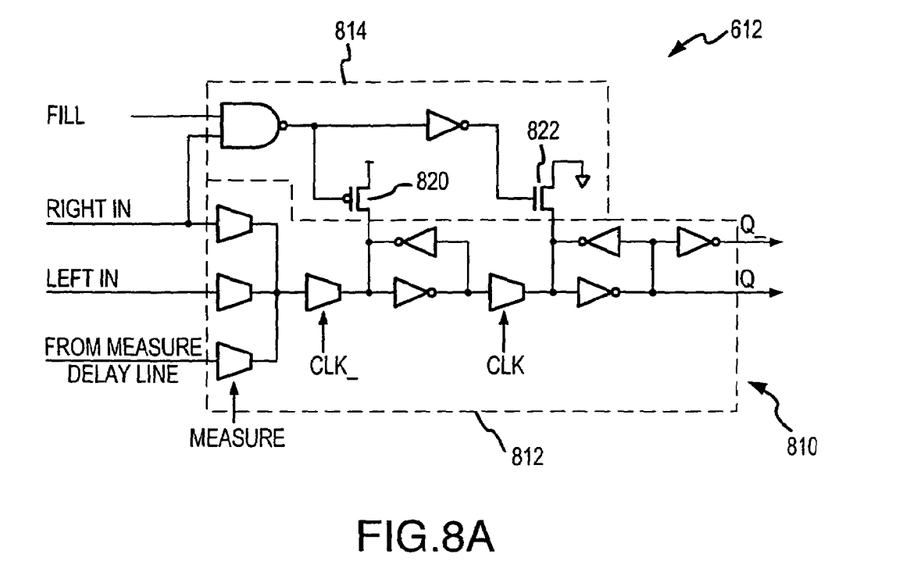
FIGS. 8A–B are schematic diagrams of exemplary fill circuits.

For example, the intermediate element 514 of the deskewing circuit 416 may operate in conjunction with the overflow circuit 612 to generate the overflow signal 618. Referring to FIG. 8A, the intermediate element according to various aspects of the present invention may include a register, such as a shift register 810, and the overflow circuit 612 may control the output of the register. The intermediate element suitably comprises multiple cells 514. The shift register 810 may comprise any circuit for storing information, such as a conventional shift register. The shift register 810 suitably comprises multiple register cells 812.

The overflow circuit 612 suitably comprises a fill circuit. The fill circuit selectably causes the contents of one or more register cells 812 to be set to a selected value, such as logic HIGH. The fill circuit may be implemented in any suitable manner to generate the overflow signal. For example, the fill circuit may be configured to store selected values in particular register cells 812 upon detection of the overflow condition.

In the present embodiment, the fill circuit comprises multiple stages 814 to control the contents of the register cells 812. Each fill circuit stage 814 suitably operates in conjunction with a corresponding register cell 812. Still referring to FIG. 8A, the shift register cell 812 is coupled to the exemplary fill circuit stage 814. The shift register cell 812 includes a RIGHT IN input connected to the output of the register cell to the right and a LEFT IN input connected to the output of the register cell to the left. The shift register cell 812 also includes a measure delay line input to receive input from a corresponding stage of the measure delay line 512.

The fill circuit stage 814 suitably responds to a control signal (FILL) to enable the fill circuit stage 814. When the control signal is deactivated, two transistors 820, 822 are turned off, thus isolating the shift register cell 812 from the fill circuit stage 814. When the control signal is activated, the transistors 820, 822 are activated upon a logic HIGH signal asserted at the RIGHT IN input. Consequently, when the logic HIGH entry point is detected and stored in the register cell 812 to the right, it drives the noninverting output of the next shift register cell 812 to logic HIGH, regardless of the input at the RIGHT IN, LEFT IN, or measure delay line inputs. The logic HIGH output is also provided to the next register cell 812 to the left at its RIGHT IN input, thus causing the logic HIGH value to propagate across the register cells 812 to the left.

The fill circuit 814 may be implemented in any suitable manner to store a desired value and generate a desired overflow signal. For example, referring to FIG. 8B, an alternative fill circuit 814 stage comprises a NAND gate 824 in place of one of the inverters of the shift register cell 812. The second input of the NAND gate 824 is connected to the inverting input of the shift register cell 812 to the right. Thus, if the noninverting output of the preceding shift register cell is logic LOW, the present shift register cell 812 stores a value corresponding to the value received from the selected RIGHT IN, LEFT IN, or measure delay line input. If the noninverting output of the preceding shift register cell is logic HIGH, however, the noninverting output of the NAND gate 824 is logic HIGH. The logic LOW signal from the inverting output is also provided to the next register cell to the left at its RIGHT IN input, thus causing the logic HIGH value to propagate across the register cells 812 to the left.

Figure 8B:
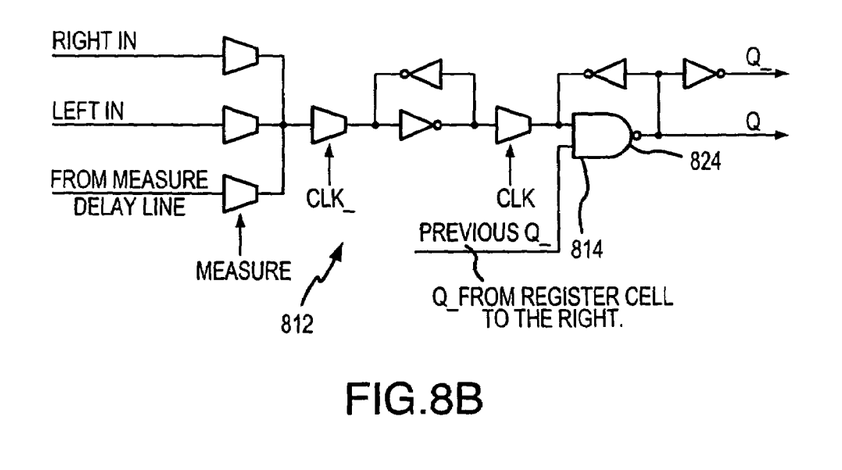

The fill circuit 814 may thus propagate the logic HIGH value through the remaining register cells 812 of the shift register 810. Consequently, the fill circuit 814 tends to assure that an overflow condition may be indicated by the last shift register cell 812. If the entry point 310 is detected, the logic HIGH value propagates to the last shift register cell 812. On the other hand, if the entry point 310 is not detected within the relevant operational range, an overflow condition has occurred, and all of the shift register cells 812 contain a logic LOW value. Accordingly, the overflow condition may be detected by accessing only the last shift register cell 812 at the end of the selected period, such as upon expiration of a timer corresponding to the duration of the entire measure delay line 512. If the last shift register cell 812 contains a logic HIGH value, the entry point 310 was detected; if not, no entry point was detected, and an overflow condition has occurred. Thus, the last shift register cell 812 provides the overflow signal.

Figure 9:
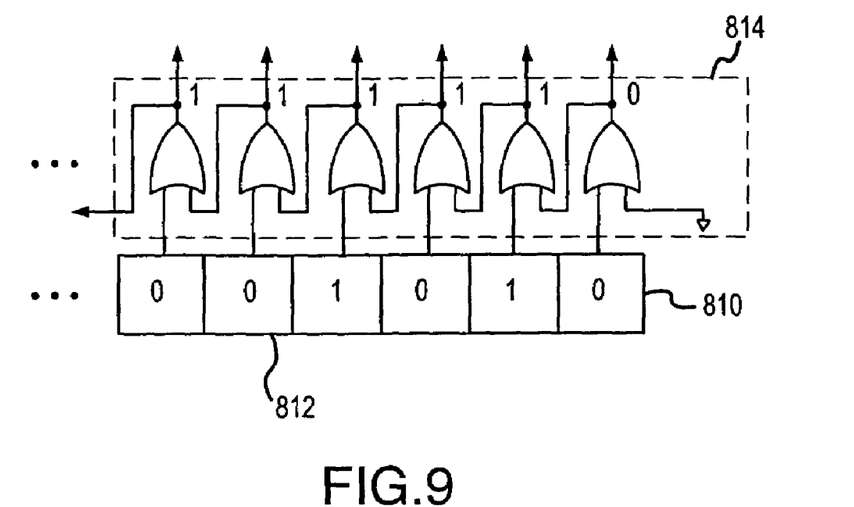
FIG. 9 is a schematic diagram of an alternative exemplary fill circuit.

The operation control circuit 518 may be configured in any appropriate manner to propagate the selected value across the intermediate element 514. For example, the operation control circuit 518 may change the output of the intermediate element 514 without changing the contents of the intermediate element 514. For example, referring to FIG. 9, an alternative embodiment of the fill circuit 814 comprises multiple OR gates. The first input of each OR gate is connected to the output of a corresponding register cell 812, and the second input is connected to the output of the preceding OR gate. The second input of the initial OR gate is connected to a logic LOW signal. With this configuration, the outputs of the OR gates are logic LOW until the first logic HIGH, corresponding to entry point 310 detection, is output from the shift register 810. When the first logic HIGH value is placed in the shift register 810, the outputs of the corresponding OR gate and each subsequent OR gate are driven, following an output settling time, to logic HIGH as well. Thus, an overflow condition may be detected solely by accessing the final register cell 812 at any appropriate time, such as when sufficient time has passed since reception of the input signal to exceed to maximum time of the measure delay line 512.

Figure 10:
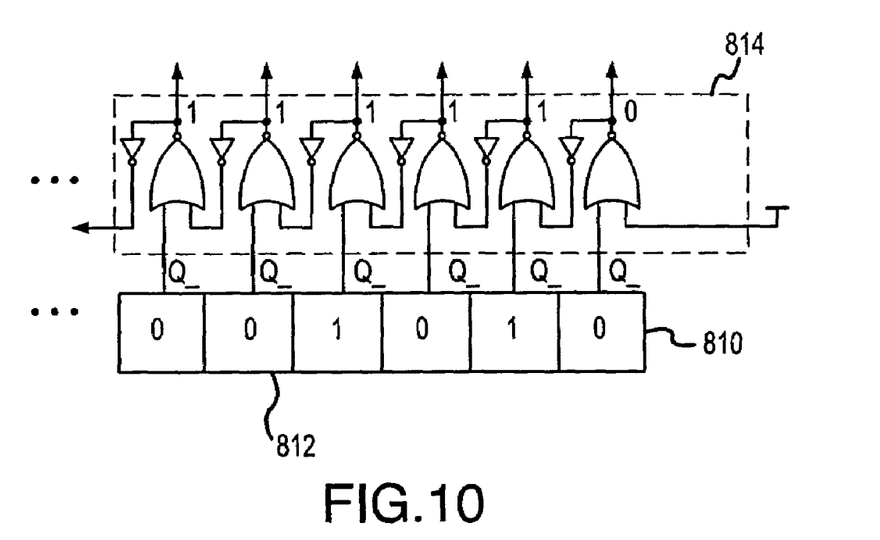
FIG. 10 is a schematic diagram of an alternative exemplary fill circuit.

Alternative operation control circuits 518 may be implemented to accomplish similar results. For example, referring to FIG. 10, the fill circuit 814 may be implemented using NAND gates and inverters. Each NAND gate has a first input connected to the inverting output of the corresponding register cell 812 and a second input connected to the output of the preceding NAND gate via a corresponding inverter. The second input of the initial NAND gate is connected to a logic HIGH signal. With this configuration, like the OR gate configuration of FIG. 9, the outputs of the NAND gates are logic LOW until the first logic HIGH, corresponding to entry point 310 detection, is stored in the register 810. When the first logic HIGH value is placed in the register 810, the outputs of the corresponding NAND gate and each subsequent NAND gate of the fill circuit 814 switches to logic HIGH as well.

The operation control circuit 518 may be configured to reduce power consumption of the deskewing circuit 416. For example, the operation control circuit 518 may include a clock select circuit to selectively enable and disable signals provided to components of the CSD circuit 500, such as the measure delay line 512, the intermediate element 514, and/or the variable delay line 516. Referring again to FIG. 6, an exemplary embodiment of the clock select circuit 610 operates in conjunction with the status signals 616 from the various segments 614. The clock select circuit 610 responds to the status signal 616, for example to save power and/or reduce noise.

In the present embodiment, the clock select circuit 610 is configured to disable the clock signal 620 provided to one or more segments 614 when the status signal 616 indicates that the entry point has been detected. The clock select circuit 610 suitably comprises a logical system having a logical NAND gate 622A–D corresponding to each segment 614A–D. Each NAND gate 622A–D receives the clock signal 620 and the status signal 616A–D for the corresponding segment 614A–D. The output of the gate 622 is connected to the clock input of the corresponding segment 614A–D. Thus, when the status signal is logic HIGH, indicating that the entry point has not been detected by the segment 614A–D, the clock signal 620 is transmitted by the gate 622 to the segment 614. When the entry point is detected, the segment 614 drives the status signal logic LOW, disabling the clock signal 620 provided to the segment 614.

The clock select circuit 610 is also suitably configured to operate in conjunction with the overflow circuit 612 to control the operation of the CSD circuit 500. For example, the clock select circuit 610 may be configured to disable the clock signal 620 provided to the measure delay line 512 according to signals from the overflow circuit 612. The clock select circuit 610 may comprise a logical system having a three-input logical NAND gate 622 dedicated to each segment 614. Each NAND gate 622 receives the system clock signal 620 and the status signal 616 for the corresponding segment 614, and the output of the gate 622 is connected to the clock input of the corresponding segment 614. The third input of each NAND gate 622 receives a clock control signal 624 from the overflow circuit 612.

The clock select circuit 610 may respond according to any appropriate criteria. In the present embodiment, the overflow circuit 612 suitably signals the clock select circuit 610 to disable selected segments 614 upon detection of the entry point. In particular, the overflow circuit 612 monitors the status signals 616 from the segments 614 and, upon detection of the entry point by one of the segments 614, drives the clock control signal 624 logic LOW for all subsequent segments 614 in the measure delay line 512. Driving the clock control signal 624 logic LOW disables the clock signal 620 provided to the particular segment 614, thus reducing power consumption and noise generation for each of the relevant segments 614.

In operation, the deskewing circuit 416 of the present embodiment detects the entry point 310 and automatically terminates the clock signal to the remaining segments 614 of the measure delay line 512. If no entry point 310 is detected, the deskewing circuit 416 adjusts the overflow signal to indicate that no entry point 310 was detected.

Figure 7:
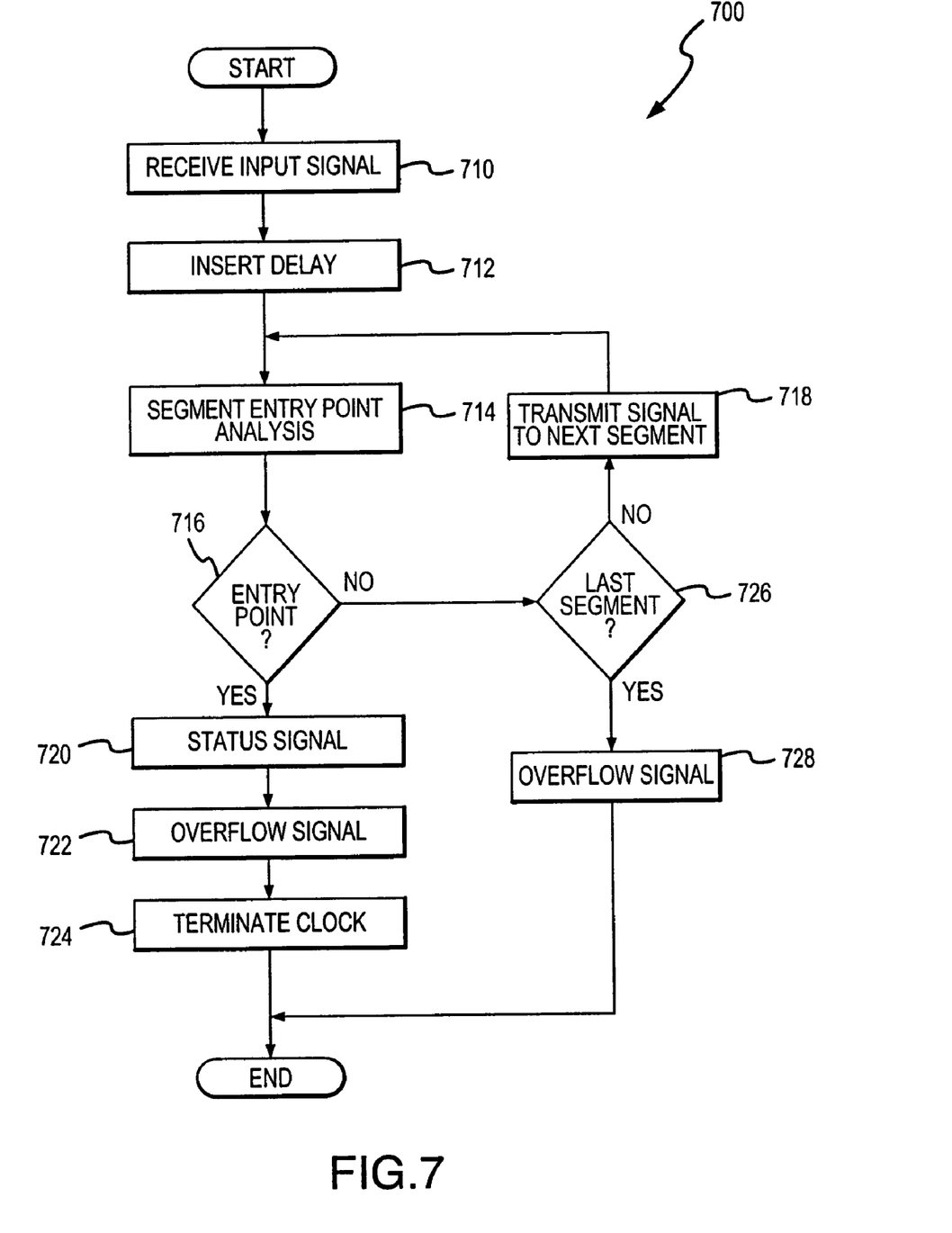
FIG. 7 is a flow diagram of an exemplary operation process.

For example, referring to FIG. 7, the deskewing circuit 416 as described in conjunction with FIG. 6 performs deskewing process 700 by initially receiving an input signal, for example from the clock generator 114, via the buffer 520 (step 710). The input signal is transmitted to the delay monitor circuit 510, which causes a propagation delay of a selected duration (step 712). The delayed signal from the delay monitor circuit 510 is then provided to the delay measure line 512 to monitor the signal for the entry point 310.

The signal initially enters the first segment 614A (step 714). If the entry point 310 is not detected in a particular segment (step 716), the signal propagates to the next segment 614B (step 718). On the other hand, if any stage 210 in the segment 614 detects the entry point 310, the segment 614 adjusts the status signal 616 to indicate entry point 310 detection (step 720). When the status signal 616 indicates entry point 310 detection, the overflow circuit 612 receives the status signal 616 and responds according to any appropriate criteria. For example, in the present embodiment, the overflow circuit 612 adjusts the overflow signal 618 to indicate that an overflow condition has not occurred (step 722). In addition, the overflow circuit 612 provides a signal to the clock select circuit 610, which suitably terminates the clock signal to the subsequent segments 614 of the measure delay line 512 (step 724). If the signal propagates fully through the measure delay line 512 without entry point 310 detection (step 726), however, the overflow circuit 612 may indicate an overflow condition using the overflow signal 618 (step 728), for example by setting an overflow flag.

If the entry point 310 is detected, the measure delay line 512 suitably generates the measure delay signal corresponding to the measured delay and provides it to the intermediate element 514. The intermediate element 514 provides the measure delay signal to the variable delay line 516, which then generates the variable delay signal following a delay corresponding to the measure delay signal. The variable delay signal is amplified and distributed by the output driver circuit 522.

The operation control circuit 518 according to various aspects of the present invention may also be configured to reduce power consumed and/or noise generated by other components of the deskewing circuit 416. For example, the operation control circuit 518 may be configured to terminate the clock signal applied to the variable delay line 516 upon entry point 310 detection. The operation control circuit 518 is suitably connected to the intermediate element 514 to receive the measure delay signal and to the variable delay line 516 to control the clock signal provided to the variable delay line 516.

Figure 11:
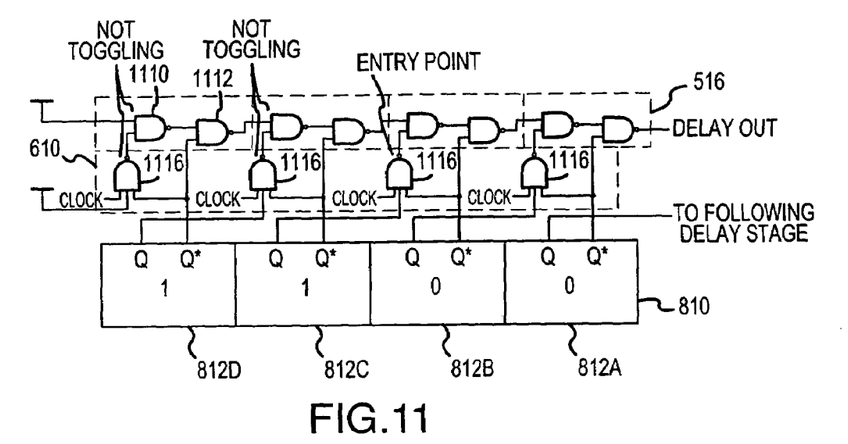
FIG. 11 is a schematic diagram of an exemplary clock select circuit.

Referring to FIG. 11, the variable delay line 516 suitably comprises multiple stages to create the desired delay. Each stage of the variable delay line 516 may comprise a conventional delay stage 1108, such as a pair of NAND gates 1110, 1112. The first NAND gate 1110 has a first input connected to the preceding stage 1108 to receive the propagating the variable delay signal and a second input connected to the clock select circuit 610. The clock select circuit 610 provides the clock signal to the first NAND gate 1110 according to a selection criteria. The second NAND gate 1112 of the stage 1108 has a first input connected to the output of the first NAND gate 1110. The second NAND gate 1112 also suitably includes a second input connected to the inverting output of the corresponding portion of the intermediate element 514, such as the inverting output of the corresponding register cell 812 of the shift register 810.

The clock signal may be provided to the first NAND gate 1110 according to any suitable criteria, for example to terminate the clock to the first NAND gate 1110 if the entry point 310 is detected. In the present embodiment, the entry point 310 is detected if a corresponding register cell 812C contains a logic HIGH value and the preceding register cell 812B contains a logic LOW value. In the present embodiment, the clock select circuit 610 comprises multiple NAND gates 1116, such that the output of each NAND gate 1116 is connected to the input of the corresponding first NAND gate 1110 of the variable delay line stages. A first input of each clock select circuit 610 NAND gate 1116 is connected to the system clock signal, for example from the clock generator 414. A second and a third input of each clock select circuit 610 NAND gate 1116 is connected to the output of the corresponding stage of the shift register 810 and the inverting output of the preceding stage of the intermediate element 514, respectively. In this configuration, only the stage of the variable delay line 516 corresponding to the entry point 310 is enabled to initiate the variable delay signal. Thus, the clock signal is only provided to the variable delay line 516 for the stage corresponding to the entry point. The clock signal to subsequent stages is terminated.

In various implementations, the intermediate element 514, the operation control circuit 518, and/or the variable delay line 516 may require a settling time to adjust values based on the signals provided and/or relevant commands. For example, in the embodiment of FIG. 11 in which the intermediate element 514 includes the shift register 810, all toggling of stages subsequent to the entry point 310 is terminated. When a shift-left command is encountered, however, the subsequent bit may not be correctly preconditioned, causing a duty-cycle error on the falling edge of the output.

Figure 12:
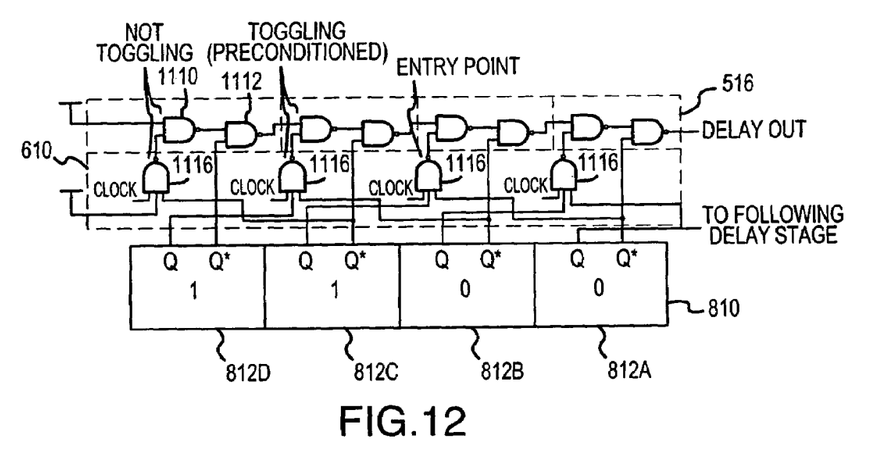
FIG. 12 is a schematic diagram of an alternative exemplary clock select circuit.

The deskewing circuit 416 may be configured to remedy such potential problems. For example, referring to FIG. 12, the clock select circuit 610 of FIG. 11 may be reconfigured so that the third input of each clock select circuit 610 NAND gate 1116 is connected to the inverting output of the shift register 810 cell preceding the relevant cell by two. In this configuration, the variable delay line 516 stage subsequent to the entry point 310 receives the clock signal to precondition the delay stage. When a shift-left command occurs, the variable delay line 516 is properly preconditioned such that no duty cycle error occurs.

The present invention is described with reference to various preferred embodiments. However, changes and modifications may be made to various exemplary embodiments without departing from the scope of the present invention. These and other changes or modifications are intended to be included within the scope of the present invention as set forth in the appended claims.

The invention claimed is:

1. A memory device comprising:
  a delay measuring circuit configured to receive an input signal and generate a synchronized signal, said delay measuring circuit including:
    a measure delay line configured to measure a delay in the input signal and generate the measured delay signal according to the delay in the input signal;
    a variable delay line configured to receive the measured delay signal and generate a synchronized signal according to the measured delay signal; and
    an operation control circuit configured to receive the measured delay signal and perform at least one of: (a) detecting an overflow condition in the measure delay signal and adjusting an overflow signal according to the detection the overflow condition, and (b) detecting an entry point in the measured delay signal and terminating a signal according to the detection of the entry point.

2. A memory device according to claim 1, wherein:
  the measure delay line comprises more than one stage; and
  the operation control circuit comprises more than one stage, wherein: each operation control circuit stage is connected to a corresponding measure delay line stage and receives at least a portion of the measured delay signal; one of the operation control circuit stages is a final stage; and the final stage generates an overflow signal according to the detection of the overflow condition.

3. A memory device according to claim 2, wherein the operation control circuit is configured to store a selected value in the final stage upon the detection of the overflow condition.

4. A memory device according to claim 2, wherein the operation control circuit is configured to provide a selected output to the variable delay line according to the detection of the overflow condition.

5. A memory device according to claim 1, wherein the measure delay line is further configured to generate a status signal upon detection of the entry point, and the operation control circuit is configured to receive the status signal and adjust the overflow signal in response to the status signal.

6. A memory according to claim 1, wherein the operation control circuit includes a clock select circuit configured to terminate a clock signal to a selected portion of the delay measuring circuit according to the detection of the entry point.

7. A memory according to claim 6, wherein:
  the delay measuring circuit comprises more than one output stage; and
  the clock select circuit comprises more than one control stage, wherein each clock select circuit control stage is connected to a corresponding output stage.

8. A method of synchronizing a first signal to a second signal, comprising the steps of:
  measuring a delay between the first signal and the second signal;
  generating a measured delay signal corresponding to the measured delay;
  detecting an overflow condition in the measured delay signal, wherein the step of detecting the overflow condition in the measured delay signal comprises the step of monitoring the measured delay signal for a selected period to determine an entry point; and
  adjusting an overflow signal when the overflow condition is detected, wherein the step of adjusting the overflow signal when the overflow condition is detected comprises the step of asserting the overflow signal if the entry point is not detected in the measured delay signal for the selected period.

9. The method of claim 8, wherein step of detecting the overflow condition in the measured delay signal comprises the step of accessing a final portion of the measure delay signal.

10. The method of claim 9, wherein the step of adjusting the overflow signal when the overflow condition is detected comprises the step of providing a selected value from the final portion of the measure delay signal.

11. The method of claim 8, further comprising the step of terminating an input signal according to the measured delay signal.

12. The method of claim 11, wherein the step of terminating the input signal according to the measured delay signal comprises the steps of:
  monitoring the measured delay signal for an entry point; and
  terminating the input signal upon a detection of the entry point.

13. A method of synchronizing a first signal to a second signal, comprising:
  measuring a delay between the first signal and the second signal;
  generating a measured delay signal corresponding to the measured delay;
  detecting an overflow condition in the measured delay signal;
  adjusting an overflow signal when the overflow condition is detected; and
  terminating an input signal according to the measured delay signal.

14. The method of claim 13, wherein the step of terminating the input signal according to the measured delay signal comprises the steps of:
  monitoring the measured delay signal for an entry point; and
  terminating the input signal upon a detection of the entry point.

15. A measure-controlled delay circuit, wherein the measure-controlled delay circuit comprises:
  a delay measuring circuit configured to receive a clock signal and a delayed input signal and generate a measured delay signal; and
  an operation control circuit having a component and configured to perform the following functions: (a) detect an overflow condition in the measured delay signal and adjust an overflow signal, and (b) detect an entry point in the measured delay signal and terminate the clock signal to the component, wherein the delay measuring circuit includes a measure delay line configured to generate a status signal upon the detection of the entry point; and the operation control circuit is configured to receive the status signal and adjust the overflow signal in response to the status signal.

* * * * *